United States Patent [19]

Karpowycz et al.

[11] 3,882,399

[45] May 6, 1975

[54] RADIO OR TELEVISION RECEIVER TUNING INDICATOR

[75] Inventors: Oleh Karpowycz, Addison; Walter Klymkiw, Chicago, both of Ill.

[73] Assignee: Zenith Radio Corporation, Chicago, Ill.

[22] Filed: Nov. 5, 1973

[21] Appl. No.: 412,848

[52] U.S. Cl. ..................... 325/455; 334/30; 334/36

[51] Int. Cl. ..................... H03j 3/14

[58] Field of Search ................... 334/30, 36, 37, 86; 325/455; 116/124.1 R, , 124.4

[56] References Cited

UNITED STATES PATENTS

| | | | |
|---|---|---|---|
| 2,120,136 | 6/1938 | Lyman | 334/36 |
| 3,571,714 | 3/1971 | Traub | 334/36 X |
| 3,732,498 | 5/1973 | Beckman et al. | 325/455 X |

*Primary Examiner*—Paul L. Gensler
*Attorney, Agent, or Firm*—John J. Pederson; Cornelius J. O'Connor

[57] ABSTRACT

An indicator system for a radio or television receiver for indicating a tuned or detuned condition in the receiver. In the preferred embodiment of the invention, the indicator system utilizes three light emitting diodes (LED's) integrally mounted with the dial pointer assembly, preferably with a green LED flanked in the direction of pointer movement by two red LED's. When the receiver is properly tuned the green LED is energized. Conversely, when the receiver is detuned one of the flanking red LED's is energized, and the direction of detuning is indicated by the particular red LED which is energized, so that correct tuning may be established by moving the pointer in a direction opposite to that indicated by the illuminated red LED until it becomes extinguished and the green LED alone remains illuminated.

2 Claims, 3 Drawing Figures

RADIO OR TELEVISION RECEIVER TUNING INDICATOR

BACKGROUND OF THE INVENTION

The present invention relates generally to an improvement in radio and television receivers, more particularly to an indicator system for fine tuning a receiver.

Prior to the present invention, most fine tuning aids have been visual and have been arranged in various positions on the receiver's face at a location spaced from the dial pointer assembly or readout display. Prior tuning aids include both meter and lamp systems, most of which correspond to signal strength depicting simply a tuned or detuned state and not the degree or direction of detuning or the preciseness of tuning.

In certain prior art AM-FM radios with a meter fine tuning aid, the meter operates in one manner for FM reception and in a different manner for AM operation. In FM operation the meter displays the tuning error by deflection from a preset zero position, whereas in AM operation the meter shows the optimum tuning position by a meter deflection from a predetermined zero to a maximum deflection point. This results in confusion to the operator and either improper use or non-use of the fine tuning aid.

Another disadvantage of most meter systems is the meter's insensitivity. The control signal must be of considerable magnitude for meter deflection to occur. In effect, it appears to the operator that a tuned condition exists over a broader band than it actually does exist.

Further, in many prior art systems for AM receivers, the control signal for actuating the fine tuning indicator is taken from the automatic gain control (AGC) circuitry. In these systems, the signal received by the tuning indicator is proportional to the AGC signal, (which is the DC component of the AM detector audio output signal); therefore in a meter system, only a maximum deflection position is indicated on the meter and in a lamp system the intensity of the lamp varies with the strength of the signal.

There are prior art systems comprising a lamp fine tuning aid, but usually the lamp is very insensitive and shows only that the receiver is tuned or detuned. It does not indicate the direction of the detuning and because of the insensitivity of the indicator it does not accurately represent a tuned state, that is, the tuned condition is not precise.

In a majority of the prior art systems, the fine tuning aid is spaced from the receiver's dial scale. As the receiver is tuned to the desired broadcast station, the operator's eyes are generally affixed to the pointer as it traverses the dial scale. Accordingly, if the operator wishes to fine tune the receiver by using the fine tuning aid he must divert his eyes from the pointer to the tuning indicator wherever it is located. This increases the complexity of the fine tuning system and often results in non-use of the system as an aid to fine tuning.

OBJECTS OF THE INVENTION

Accordingly, it is an object of the invention to provide an improved fine-tuning indicator system for a radio or television receiver.

A more particular object of the invention is to provide an improved fine tuning indicator system that is directly associated with the tuner's readout display and enables the operator to simultaneously observe the fine tuning aid and the readout display while tuning the receiver, that is, to observe both without having to focus first on the readout display and then on the fine tuning aid or vice versa.

A further object of the invention is to provide a fine tuning indicator system for radio and television receivers that denotes both precise tuning and the direction as well as the fact of detuning.

It is also an object of this invention to provide a fine tuning aid for AM-FM radio receivers which functions in the same manner for both FM and AM operation, making it both simple and convenient for the operator to use and understand.

BRIEF DESCRIPTION OF THE DRAWINGS

The features of the invention which are believed to be novel are set forth with particularity in the appended claims. The invention, together with further objects and advantages thereof, may best be understood by reference to the following description taken in conjunction with the accompanying drawings. In the several figures, like reference numerals identify like elements, and:

DESCRIPTION OF THE PREFERRED EMBODIMENT

Figure 1:
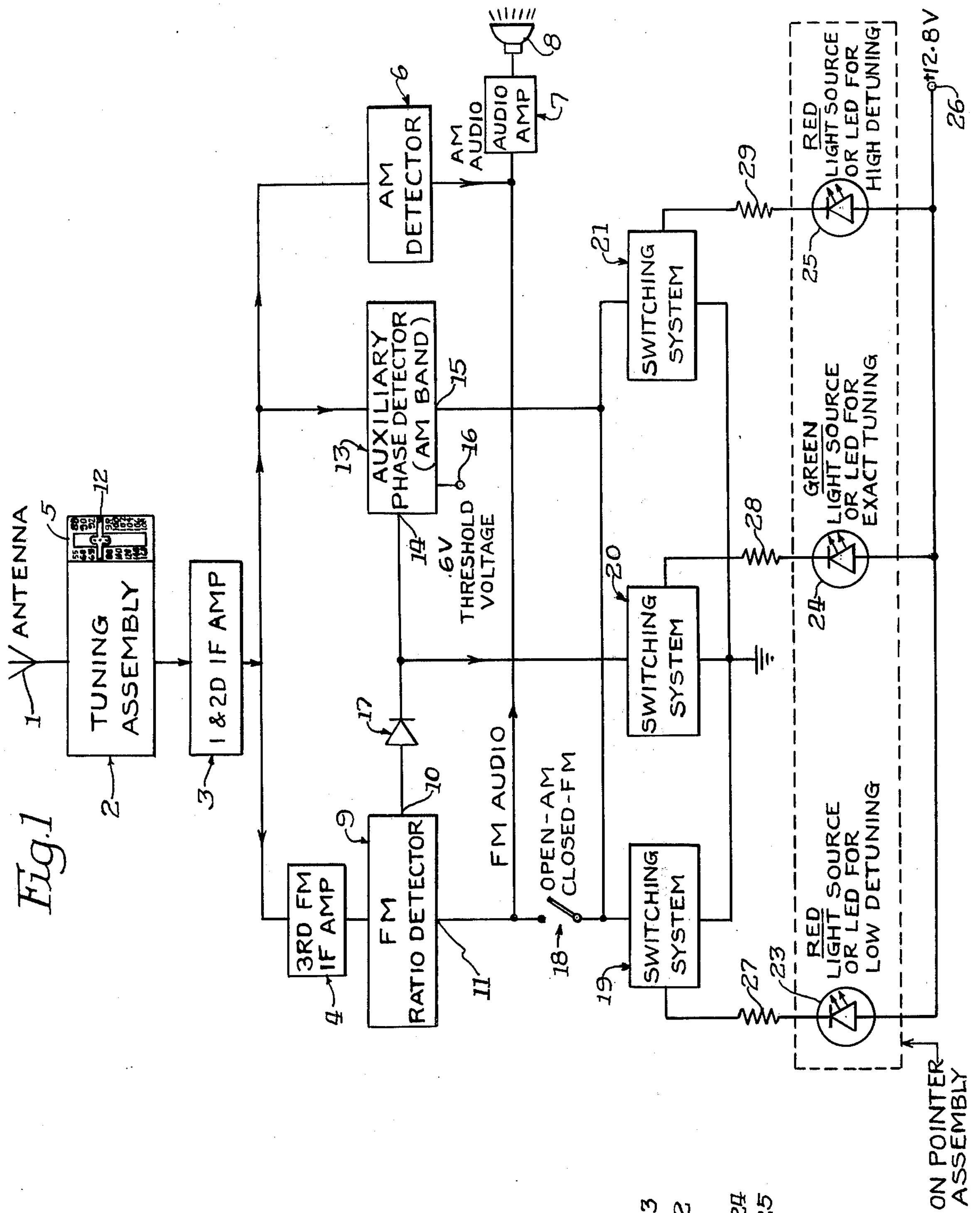
FIG. 1 is a block diagram of an AM-FM radio receiver which includes a fine tuning indicator system in accordance with the invention.

The receiver of FIG. 1 includes an antenna 1 which intercepts broadcast signals and couples them in the conventional manner to radio frequency (RF) amplifier and converter stage (tuning assembly 2) wherein the signals are amplified and translated to an IF or intermediate frequency. The resultant IF signal is coupled to AM/FM intermediate frequency amplifier stages 3 and 4.

During AM signal reception, an IF output signal from IF amplifier 3 is coupled to an AM detector 6 where the AM wave is detected. The detected AM signal is then coupled to a conventional audio amplifier 7, which in turn drives loudspeaker 8.

When the receiver is operated in the FM mode, an IF output signal from IF amplifier 4 is coupled to an FM ratio detector and filter 9 in the conventional manner wherein the received FM transmission is demodulated to obtain an audio signal at the detector's output terminal 11. This signal is coupled to audio amplifier 7, which in turn drives loudspeaker 8.

As thus far described, the receiver is conventional in construction and operation. More particular consideration may now be given to that portion of the receiver which relates to the preferred embodiment of the present invention, in general a visual, fine tuning indicator system associated with the receiver's readout display or more particularly with the dial pointer assembly.

The preferred embodiment of the present invention comprises a single pole switch 18 coupled to the FM ratio detector 9 at terminal 11, the auxiliary phase detector 13 at terminal 15 and switching systems 19 and 21. When the receiver is being operated in the AM mode, switch 18 is open so the FM ratio detector will not load down the AM operation. Conversely, during FM operation switch 18 is closed. Diode 17 is coupled to FM ratio detector 9 at terminal 10, to auxiliary phase detector 13 at terminal 14, and to switching system 20. Diode 17 operates as a one-way switch preventing current from flowing to terminal 10 in the AM mode of operation, thus preventing FM ratio detector 9 from loading switching system 20 in the AM mode of operation.

Switching system 20 has three terminals; an input or control terminal is coupled to FM ratio detector 9 through diode 17 and to auxiliary phase detector 13, a second terminal is returned to ground, and the third terminal couples switching, system 20 to a current limiting resistor 28 which in turn is coupled to the cathode of green LED 24. The anode of LED 24 is coupled to a 12.8 volt DC voltage source 26.

An input terminal of switching system 19 is coupled to FM ratio detector 9 through switch 18 and to auxiliary phase detector 13, a second terminal is returned to ground, and a third terminal couples switching system 19 to current limiting resistor 27 which in turn is coupled to the cathode of red LED 23. The anode of LED 23 is coupled to DC voltage source 26. Similarly, a control terminal of switching system 21 is connected to the control terminal of switch 18, a second terminal is connected to ground, and a third terminal couples switching system 21 with current limiting resistor 29 which is coupled to the cathode of red LED 25. The anode of LED 25 is coupled to DC voltage source 26.

Auxiliary phase detector 13, coupled to the second IF amplifier stage 3, is used to control operation of the indicator system when the receiver is operating in the AM band. Output terminal 14 couples auxiliary phase detector 13 to switching system 20 and output terminal 15 couples the detector to switching system 19 and switching system 21. A 0.6 volt source 16 is coupled to the auxiliary phase detector 13. This source is used both as a threshold voltage source to bias switching systems 19, 20 and 21 so that each respective switching system is sensitive to very small changes in potential at terminals 10, 11, 14 and 15 of the respective phase and ratio detectors, and to stabilize operation of the respective switching systems with respect to component temperature fluctuations.

Figure 3:
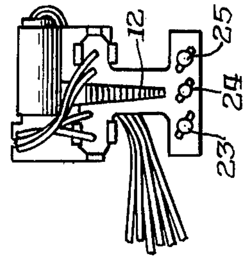
FIG. 3 is a front view of a pointer assembly embodying a three light indicator system in accordance with the invention.

In the preferred embodiment of the present invention, the three-light fine tuning aid as shown in FIG. 3 generally operates as follows. The operator of the receiver selects a station by turning the control knob that actuates the receiver's tuner and simultaneously moves the dial scale pointer. When a precise tuned signal is received, the green LED, located on the pointer assembly and between the two red LED's, is energized. When the operator commences detuning to the low side of the precise tuned signal the green LED remains energized even though the left red LED is energized as well. This signifies that a tuned signal (by the energization of the green LED) is still being received but it is not the precise tuned signal, that is, it is on the low side of the band that denotes the tuned signal. Further detuning to the low side of the precise tuned signal results in energization of only the left red LED, with the center green LED being de-energized, thus denoting a detuned condition on the low side of the desired station. Similarly, detuning to the high side of a tuned signal results in both the center green LED and the right red LED being energized when a tuned signal but not the precise tuned signal is received. Also further detuning to the high side results in only the right red LED being energized thus denoting a detuned state higher than the desired tuned state.

When the receiver is operating in the AM mode, auxiliary phase detector 13 receives a signal which is either tuned or detuned to the tuned circuitry of the phase detector. When the received signal represents a properly tuned receiver, that is, it matches the tuned circuitry of phase detector 13, a maximum potential is detected at output terminal 14. This maximum potential actuates switching system 20 which effectively becomes a short circuit. With a 12.8 volt potential from source 26 on the anode of LED's and switching system 20 acting as a short circuit, a predetermined amount of current flows through the green LED 24. When output terminal 14 is at the predetermined maximum potential the potential at phase detector terminal 15 is zero with reference to the threshold voltage source 16. Switching systems 19 and 21 respond only to a relative positive or negative potential at terminal 15, and accordingly both switching systems 19 and 21 effectively operate as open circuits and thus prohibit conduction of LED's 23 and 25. Therefore a maximum potential at terminal 14 and an effective zero potential at terminal 15 denotes proper tuning of the receiver.

When the auxiliary phase detector 13 receives a signal representative of detuning, that is, the signal does not match the tuned circuitry of phase detector 13, the afore-mentioned maximum potential is not detected at phase detector output terminal 14; instead some lesser potential exists at this terminal. Switching system 20 is responsive only to this predetermined maximum potential, so that it does not respond to a lesser voltage and it effectively operates as an open circuit prohibiting current flow through LED 24.

When the receiver is detuned, either a positive or negative potential, with respect to threshold voltage source 16, is developed at phase detector output terminal 15. If the received signal is detuned to the low side of a tuned signal, an effective negative potential is developed at phase detector output terminal 15. This negative potential triggers switching system 19 in such a manner that the switching system 19 is effectively a short circuit. With the 12.8 DC voltage source 26 applied to the anode of red LED 23 and switching system 19 operating as a short circuit, a predetermined amount of current flows through red LED 23. This denotes a detuned state whose frequency is lower than that frequency representing the desired tuned state.

When phase detector output terminal 15 is at a negative potential with respect to threshold voltage source 16, switching system 21 effectively operates as an open circuit and LED 25 does not conduct. When phase detector output terminal 15 is at an effective positive potential, denoting a signal that is above a tuned signal, switching system 21 responds and effectively becomes a short circuit. With a positive potential applied to the anode of LED 25 and its cathode effectively at ground, current flows through LED 25 and resistor 29. When LED 25 is conducting, a detuned state that is higher than the desired tuned state exists in the receiver.

When the receiver is operated in the FM mode, the conventional FM ratio detector 9, coupled to the third FM IF amplifier stage 4, supplies control signals to switching systems 19, 20 and 21. When the FM ratio detector 9 receives a signal that properly matches the tuned circuitry of FM ratio detector 9, a maximum potential exists at the detector's output terminal 10. Switching system 20 responds to the maximum potential at output terminal 10 and effectively becomes a short circuit whereupon current flows through green LED 24 and resistor 28 showing proper tuning of the receiver. When ratio detector 9 output terminal 10 is at any potential other than the maximum potential, switching system 20 is effectively an open circuit and green LED 24 does not conduct.

When FM ratio detector 9 receives a signal which is lower than a desired tuned frequency, a negative potential with respect to the threshold voltage source 16 exists at ratio detector output terminal 11. When output terminal 11 is at this negative potential, switching system 19 responds and effectively becomes a short circuit whereupon a predetermined amount of current flows through red LED 23 signifying a detuned state lower than a precise tuned state corresponding to a given desired frequency. Switching system 21 does not respond to an effective negative potential at output terminal 11 thus effectively operating as an open circuit forbidding red LED 25 from conducting.

When FM ratio detector 9 receives a detuned signal higher than a desired tuned frequency there exists a positive potential with respect to threshold voltage source 16 at ratio detector output terminal 11. When output terminal 11 is at this positive potential, switching system 21 responds and effectively becomes a short circuit thus allowing red LED 25 and resistor 29 to conduct. Conduction of LED 25 is representative of a detuned state higher than the precise tuned state corresponding to a given frequency. When the potential at output terminal 11 is positive with respect to the threshold voltage source 16 red LED 23 does not conduct since switching system 19 effectively remains as an open circuit.

Figure 2:
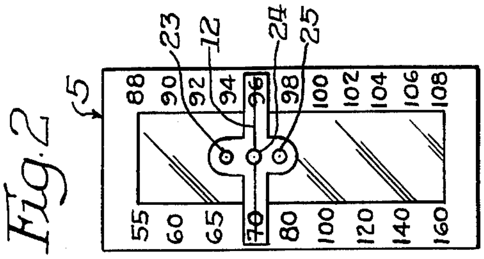
FIG. 2 is an enlarged view of the indicator system in conjunction with the pointer assembly.

Red LED 23 and red LED 25 flank green LED 24 on the pointer assembly of the dial scale on tuner 2. Referring to FIG. 2, it is noted that red LED 25 is below green LED 24 and red LED 23 is above green LED 25. When arranged in the manner represented in FIG. 2, red LED's 23 and 25 correspond to low and high detuning, respectively. Referring to FIG. 3, a different arrangement of LED's 23, 24 and 25 is noted. In FIG. 3 red LED 23 and 25 are to the left and right of green LED 24, respectively. Thus on a dial scale with the frequency scale increasing from left to right, red LED's 23 and 25 correspond to low and high frequency detuning, respectively.

The invention is not limited to the particular details of construction of the embodiments depicted and other modifications and applications are contemplated. Certain changes may be made in the above-described methods and apparatus without departing from the true spirit and scope of the invention herein involved and it is intended that the subject matter in the above depiction shall be interpreted as illustrative and not in a limiting sense.

We claim:

1. A radio receiver comprising:
means for selectively tuning RF broadcast signals;
a readout display comprising first, second and third light emitting devices for visually indicating the tuning condition of said receiver in respect to a selected broadcast signal;
a source of threshold potential;
phase detector means coupled to said tuning means and comprising a tuned circuit responsive to the IF signal associated with said selected broadcast signal for developing control signals representative of the tuning condition of said receiver,
said detector means further comprising a first output terminal and a second output terminal,
means intercoupling said tuned circuit and said source of threshold potential,
said first output terminal exhibiting a control signal of maximum amplitude upon receipt of said selected broadcast signal and a substantially smaller amplitude control signal when said tuning means is detuned from said selected broadcast signal,
said second output terminal exhibiting a signal of predetermined polarity, relative to said threshold potential, when said tuning means is tuned below the frequency of said selected broadcast signal and
exhibiting a signal of predetermined different polarity, relative to said threshold potential, when said tuning means is tuned above the frequency of said selected broadcast signal;
a first switching system intercoupling said first output terminal and said first light emitting device and responsive only to said maximum amplitude control signal to illuminate said first device when said receiver is tuned to said selected broadcast signal;
a first auxiliary switching system intercoupling said second output terminal and said second light emitting device and responsive only to a control signal of said predetermined polarity to illuminate said second light emitting device when said tuning means is tuned below the frequency of said selected broadcast signal; and
a second auxiliary switching system intercoupling said second output terminal and said third light emitting device and responsive only to a control signal of said predetermined different polarity to illuminate said third light emitting device when said tuning means is tuned above the frequency of said selected broadcast signal.

2. A radio receiver in accordance with claim 1 wherein said phase detector means includes a phase detector and a ratio detector coupled to said tuning means each having said first output terminal for supplying said maximum amplitude control signal when said receiver is properly tuned to an AM or FM broadcast signal, respectively, and each having said second output terminal for supplying said signal of predetermined polarity whenever said receiver is detuned from the respective AM or FM broadcast signal.

* * * * *